United States Patent
Laskaris et al.

(10) Patent No.: US 6,201,462 B1
(45) Date of Patent: Mar. 13, 2001

(54) OPEN SUPERCONDUCTIVE MAGNET HAVING A CRYOCOOLER COLDHEAD

(75) Inventors: Evangelos Trifon Laskaris, Niskayuna; Yu Wang, Clifton Park, both of NY (US); Timothy John Havens; Longzhi Jiang, both of Florence, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/436,829

(22) Filed: Nov. 9, 1999

(51) Int. Cl.[7] ................................................... H01F 5/00
(52) U.S. Cl. ............................................. 335/299; 335/216
(58) Field of Search .................................. 335/216, 299, 335/296, 297, 298, 300, 301

(56) References Cited

U.S. PATENT DOCUMENTS

| | | | |
|---|---|---|---|
| 5,168,211 | * 12/1992 | Laukien et al. | 324/319 |
| 5,410,287 | 4/1995 | Laskaris et al. | 335/216 |
| 5,448,214 | 9/1995 | Laskaris | 335/301 |
| 5,539,366 | * 7/1996 | Dorri et al. | 335/297 |
| 5,563,566 | 10/1996 | Laskaris et al. | 335/216 |
| 5,874,880 | 2/1999 | Laskaris et al. | 335/216 |
| 5,874,882 | 2/1999 | Laskaris et al. | 335/299 |
| 5,883,558 | 3/1999 | Laskaris et al. | 335/216 |
| 5,994,991 | * 11/1999 | Laskaris et al. | 335/299 |

* cited by examiner

*Primary Examiner*—Lincoln Donovan
(74) *Attorney, Agent, or Firm*—Marvin Snyder; Douglas E. Stoner

(57) ABSTRACT

An open magnet has vertically aligned first and second assemblies each with at least one superconductive main coil. At least one support member is vertically aligned and attached to, the first and second assemblies. At least one cryocooler coldhead is aligned generally horizontally and has a housing which is attached to, and receives weight-bearing support from, one of the first and second assemblies.

20 Claims, 5 Drawing Sheets

OPEN SUPERCONDUCTIVE MAGNET HAVING A CRYOCOOLER COLDHEAD

BACKGROUND OF THE INVENTION

The present invention relates generally to open superconductive magnets, and more particularly to an open superconductive magnet having a cryocooler coldhead.

Magnets include resistive and superconductive magnets which are part of a magnetic resonance imaging (MRI) system used in various applications such as medical diagnostics. Known superconductive magnets include liquid-helium-cooled, cryocooler-cooled, and hybrid-cooled superconductive magnets. Typically, the superconductive coil assembly includes a superconductive main coil surrounded by a thermal shield surrounded by a vacuum enclosure. A cryocooler-cooled magnet typically also includes a cryocooler coldhead externally mounted to the vacuum enclosure, having its first stage in solid conduction thermal contact with the thermal shield, and having its second stage in solid conduction thermal contact with the superconductive main coil. A liquid-helium-cooled magnet typically also includes a liquid-helium vessel surrounding the superconductive main coil with the thermal shield surrounding the liquid-helium vessel. A hybrid-cooled magnet uses both liquid helium (or other liquid or gaseous cryogen) and a cryocooler coldhead, and includes designs wherein the first stage of the cryocooler coldhead is in solid conduction thermal contact with the thermal shield and wherein the second stage of the cryocooler coldhead penetrates the liquid-helium vessel to recondense "boiled-off" helium.

Known resistive and superconductive magnet designs include closed magnets and open magnets. Closed magnets typically have a single, tubular-shaped resistive or superconductive coil assembly having a bore. The coil assembly includes several radially-aligned and longitudinally spaced-apart resistive or superconductive main coils each carrying a large, identical electric current in the same direction. The main coils are thus designed to create a constant magnetic field of high uniformity within a typically spherical imaging volume centered within the magnet's bore where the object to be imaged is placed.

Open magnets, including "C" shape and support-post magnets, typically employ two spaced-apart coil assemblies with the space between the assemblies containing the imaging volume and allowing for access by medical personnel for surgery or other medical procedures during magnetic resonance imaging. The open space helps the patient overcome any feelings of claustrophobia that may be experienced in a closed magnet design. The sharpness of an MRI image depends, in part, on the magnetic field in the imaging volume being time-constant and highly uniform, such magnetic field suffering time and spatial deformation caused by vibrations imparted to the coil assemblies by the presence of a cryocooler coldhead. What is needed is a design for an open superconductive magnet having a cryocooler coldhead which reduces vibrations imparted to the coil assemblies by the cryocooler coldhead and hence which improves the sharpness of an MRI image.

BRIEF SUMMARY OF THE INVENTION

In a first expression of an embodiment of the invention, an open magnet includes first and second assemblies, at least one support member, and at least one cryocooler coldhead. The first assembly has a longitudinally-extending and generally-vertically-aligned first axis and has at least one superconductive main coil generally coaxially aligned with the first axis. The second assembly is longitudinally spaced apart from, and positioned generally vertically below, the first assembly. The second assembly has a longitudinally-extending second axis generally coaxially aligned with the first axis, and has at least one superconductive main coil generally coaxially aligned with the second axis. The at least one support member is generally vertically aligned, has a first longitudinal end attached to the first assembly and has a second longitudinal end attached to the second assembly. The at least one cryocooler coldhead is aligned generally horizontally and has a housing attached to, and receiving weight-bearing support from, one of the first and second assemblies.

In a second expression of an embodiment of the invention, an open magnet includes first and second assemblies, non-magnetizable first and second support members, and first and second cryocooler coldheads. The first assembly has a longitudinally-extending and generally-vertically-aligned first axis, at least one superconductive main coil generally coaxially aligned with the first axis, and a first magnet pole piece generally coaxially aligned with the first axis and spaced apart from the at least one superconductive main coil of the first assembly. The second assembly is longitudinally spaced apart from, and positioned generally vertically below, the first assembly. The second assembly has a longitudinally-extending second axis generally coaxially aligned with the first axis, at least one superconductive main coil generally coaxially aligned with the second axis, and a second magnet pole piece generally coaxially aligned with the second axis and spaced apart from the at least one superconductive main coil of the second assembly. The first and second support members each: are vertically aligned; have a first longitudinal end attached to the first magnet pole piece; and have a second longitudinal end attached to the second magnet pole piece. The first and second support members are not diametrically aligned and are the only support members of the open magnet which are attached to both the first and second magnet pole pieces. The first cryocooler coldhead is generally horizontally aligned and has a first housing attached to, and receiving weight-bearing support from, one of the first and second assemblies near the first support member. The second cryocooler coldhead is generally horizontally aligned and has a second housing attached to, and receiving weight-bearing support from, one of the first and second assemblies near the second support member.

Several benefits and advantages are derived from the invention. Applicants found that, when the cryocooler coldheads are attached to, and receive weight-bearing support from, the first and/or second assembly, having the cryocooler coldhead(s) be horizontally aligned reduces vibration imparted to the assemblies by the cryocooler coldhead(s). Such vibrations are also reduced, in two-cryocooler and two-support-member magnets, by positioning the two horizontal cryocoolers in opposing alignment and in the same vertical plane as the two support members. Applicants found that cryocooler vibrations cause vibration of the superconductive main coils, cause unwanted eddy-currents generated by vibrations of the thermal shields, and cause unwanted movement of the superconductive coils relative to the pole pieces all contributing to MRI image degradation. It is noted that when the support member(s) provide a "clam-shell" support for the assemblies, the superconductive coils of such assemblies are subject to a significant "clam-shell" vibration from the cryocooler coldhead(s) which is likened to the partial closing and opening of a clam shell. It is noted that a "clam-shell" support is provided by having only two support members, especially when the two support members are not diametrically aligned. Such clam-shell support is a very open support providing ease of patient table access to the imaging volume and providing ease of patient positioning within the imaging volume.

DETAILED DESCRIPTION OF THE INVENTION

Figure 1:
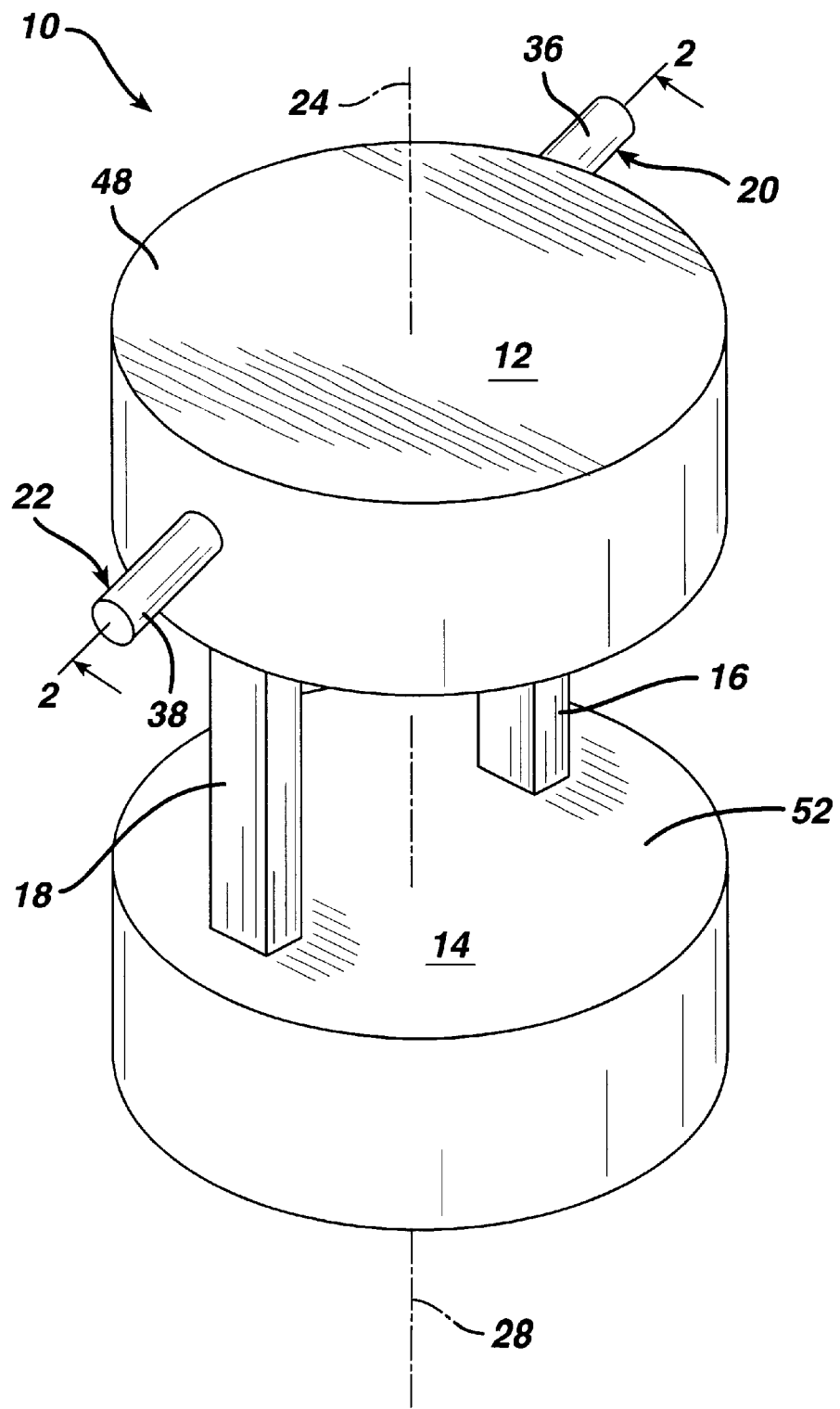
FIG. 1 is a perspective schematic view of an embodiment of an open magnet of the invention shown without a floor mount.
Figure 2:
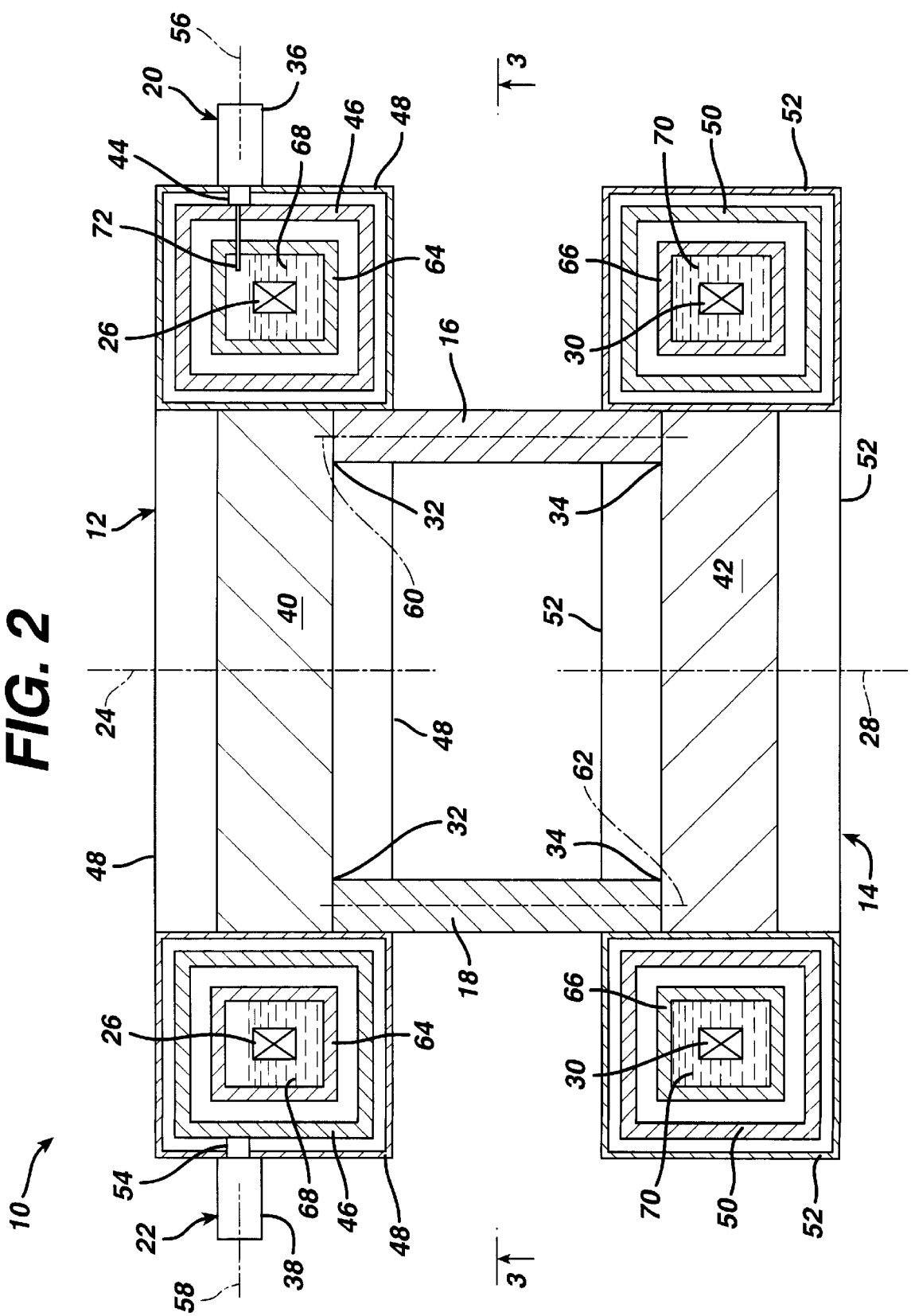
FIG. 2 is a cross-sectional view of the open magnet of FIG. 1 taken along lines 2—2 of FIG. 1 with the cryocoolers shown without hatching for clarity.
Figure 3:
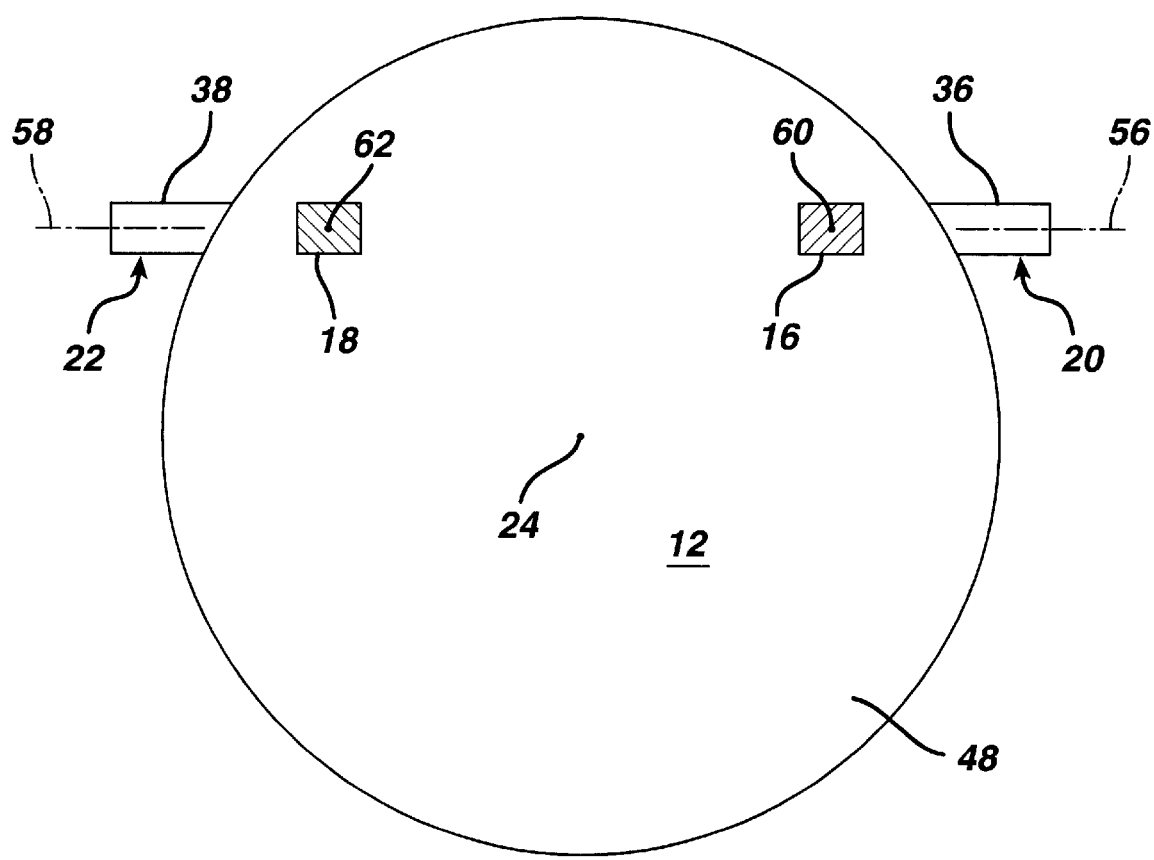
FIG. 3 is a cross-sectional view of the open magnet of FIG. 2 taken along lines 3—3 of FIG. 2.

Referring now to the drawings, wherein like numerals represent like elements throughout, FIGS. 1–3 show an embodiment of the present invention. In a first expression of an embodiment of the invention shown in 5 FIGS. 1–3, an open magnet 10 includes a first assembly 12, a second assembly 14, at least one support member 16 and 18, and at least one cryocooler coldhead 20 and 22. The first assembly 12 has a longitudinally-extending and generally-vertically-aligned first axis 24 and has at least one superconductive main coil 26 which is generally coaxially aligned with the first axis 24 and which carries a first main electric current in a first direction. The first direction is defined to be either a clockwise or a counterclockwise circumferential direction about the first axis 24 with any slight longitudinal component of current direction being ignored. By "generally-vertically-aligned" is meant vertically aligned plus or minus twenty degrees. The second assembly 14 is longitudinally spaced apart from and disposed generally vertically below the first assembly 12. The second assembly 14 has a longitudinally-extending second axis 28 which is generally coaxially aligned with the first axis 24 and has at least one superconductive main coil 30 which is generally coaxially aligned with the second axis 28 and which carries a second main electric current in the previously-defined first direction. The at least one support member 16 and 18 is generally vertically aligned, has a first longitudinal end 32 which is attached to the first assembly 12, and has a second longitudinal end 34 which is attached to the second assembly 14. The at least one cryocooler coldhead 20 and 22 is aligned generally horizontally and has a housing 36 and 38 which is attached to, and receives weight-bearing support from, one of the first and second assemblies 12 and 14. By "aligned generally horizontally" is meant aligned horizontally plus or minus twenty degrees. It is noted that the at least one support member 16 and 18 is a weight-bearing support member having to support the weight of the first assembly 12.

In one design, the first assembly 12 includes a first magnet pole piece 40 generally coaxially aligned with the first axis 24 and spaced apart from the at least one superconductive main coil 26 of the first assembly 12, and the second assembly 14 includes a second magnet pole piece 42 generally coaxially aligned with the second axis 28 and spaced apart from the at least one superconductive main coil 30 of the second assembly 14. The first and second magnet pole pieces 40 and 42 are magnetizable meaning that they each have a relative permeability larger than generally unity. "Relative permeability" is the ratio of magnetic flux density produced in a material to the value in free space produced by the same magnetic field strength. In one construction, the at least one support member 16 and 18 is a nonmagnetizable at least one support member. A support member is said to be a nonmagnetizable support member if it includes at least a nonmagnetizable portion which blocks having a magnetizable path between its ends. Such nonmagnetizable portion would have a relative permeability of generally unity. Examples of nonmagnetizable materials include aluminum, copper, nonmagnetic stainless steel, plastic, wood, etc. In one enablement, the first longitudinal end 32 of the at least one support member 16 and 18 is attached to the first magnet pole piece 40, and the second longitudinal end 34 of the at least one support member 16 and 18 is attached to the second magnet pole piece 42.

In one construction, the at least one cryocooler coldhead 20 and 22 includes a first cryocooler coldhead 20 having a first housing 36 and a first stage 44, wherein the first housing 36 is attached to, and receives weight-bearing support from, the first assembly 12. The first assembly 12 also includes a first thermal shield 46 generally surrounding the at least one superconductive main coil 26 of the first assembly 12 and a first vacuum enclosure 48 surrounding the first thermal shield 46. The first housing 36 is attached to, and receives weight-bearing support from, the first vacuum enclosure 48, and the first stage 44 of the first cryocooler coldhead 20 is in solid conduction thermal contact with the first thermal shield 46. The second assembly 14 also includes a second thermal shield 50 generally surrounding the at least one superconductive main coil 30 of the second assembly 14 and a second vacuum enclosure 52 surrounding the second thermal shield 50. In the embodiment shown in FIGS. 1–3, there is no cryocooler attached to the second assembly 14.

Figure 4:
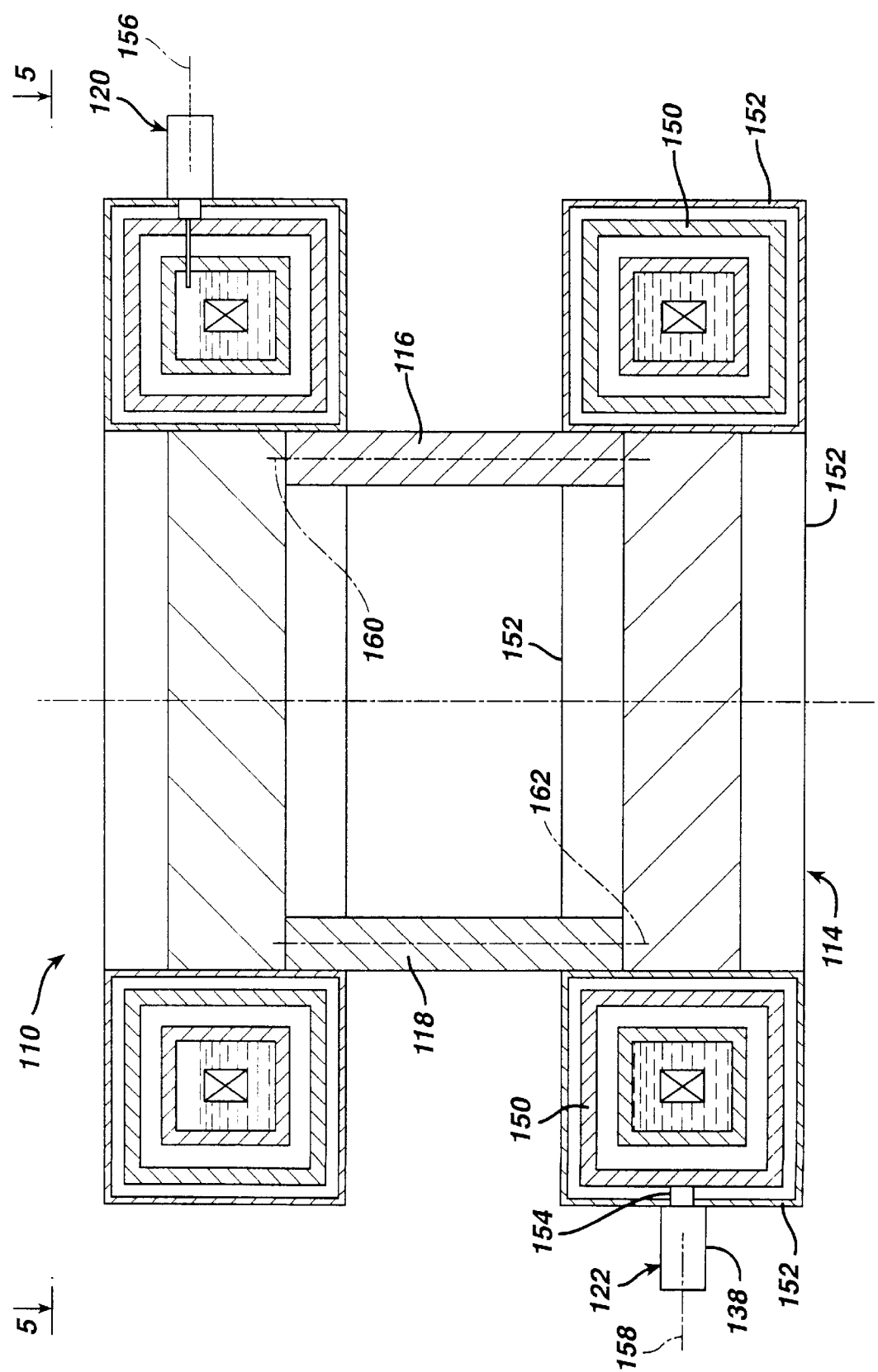
FIG. 4, is a cross-sectional view, as in FIG. 2, but of a different embodiment of an open magnet of the invention showing a different cryocooler placement.
Figure 5:
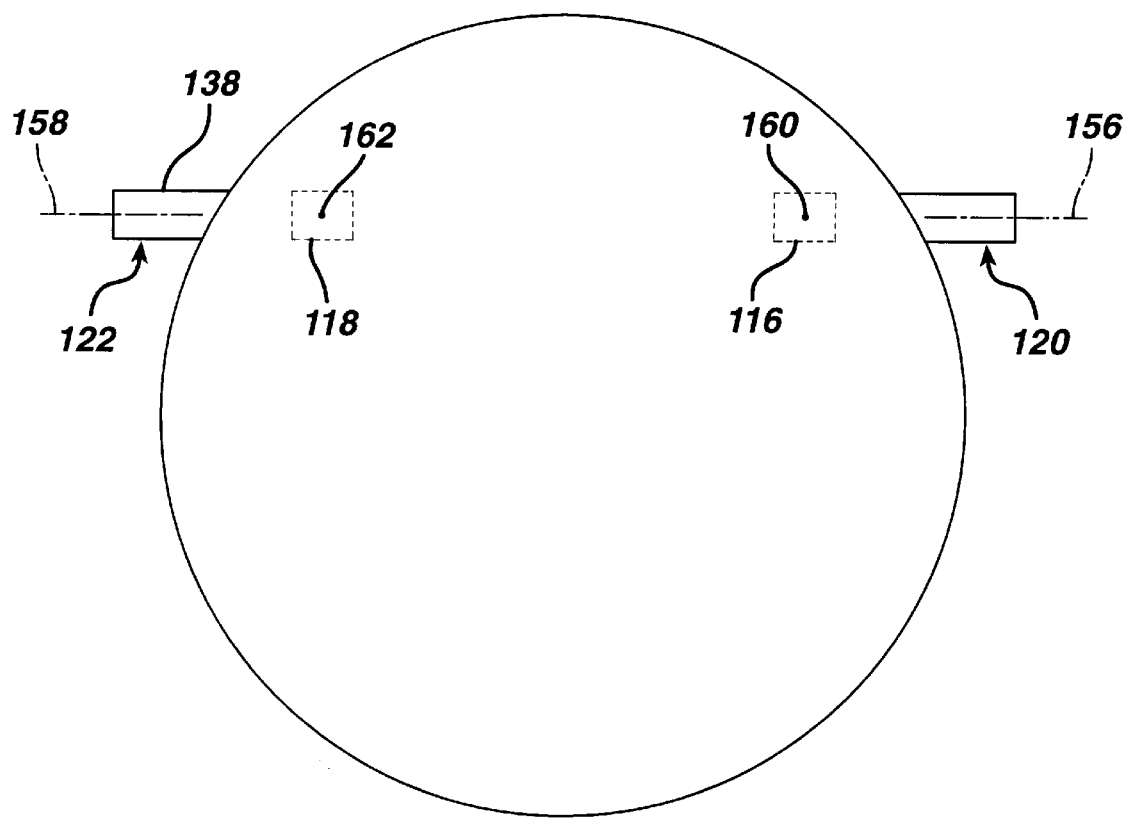
FIG. 5 is view taken along lines 5—5 of FIG. 4, with the support members shown in phantom line.

However, in a different embodiment of the open magnet 110 shown in FIGS. 4–5 (which is the same as the embodiment shown in FIGS. 1–3 except for the placement of the second cryocooler coldhead), the at least one cryocooler coldhead 120 and 122 includes a second cryocooler coldhead 122 having a second housing 138 and a first stage 154. The second housing 138 is attached to, and receives weight-bearing support from, the second vacuum enclosure 152, and the first stage 154 of the second cryocooler coldhead 122 is in solid conduction thermal contact with the second thermal shield 150. In one design, the first cryocooler coldhead 120 has a first central axis 156 (which is the axis of its coldhead cylinder and displacer piston, not shown), and the second cryocooler coldhead 122 has a second central axis 158, wherein the first central axis 156 and the second central axis 158 both generally lie in a common vertical plane.

Returning to the embodiment of FIGS. 1–3, it is seen that the second housing 38 of the second cryocooler coldhead 22 is attached to, and receives weight-bearing support from, the first assembly 12. In one design, the first cryocooler coldhead 20 has a first central axis 56, and the second cryocooler coldhead 22 has a second central axis 58, wherein the second central axis 58 is generally coincident with the first central axis 56. In one construction, the at least one support member 16 and 18 consists of a first support member 16 having a first longitudinal axis 60 and a second support member 18 having a second longitudinal axis 62, wherein the first and second longitudinal axes 60 and 62 and the first and second central axes 56 and 58 all generally lie in a common vertical plane.

In a second expression of an embodiment of the invention shown in FIGS. 1–3, an open magnet 10 includes a first assembly 12, a second assembly 14, nonmagnetizable first and second support members 16 and 18, and first and second cryocooler coldheads 20 and 22. The first assembly 12 has a longitudinally-extending and generally-vertically-aligned first axis 24, at least one superconductive main coil 26 generally coaxially aligned with the first axis 24 and carrying a first main electric current in a first direction (as previously defined in the first expression of an embodiment of the invention), and a first magnet pole piece 40 generally coaxially aligned with the first axis and spaced apart from the at least one superconductive main coil 26 of the first assembly 12. The second assembly 14 is longitudinally spaced apart from and disposed generally vertically below the first assembly 12. The second assembly 14 has a longitudinally-extending and generally-vertically-aligned second axis 28 generally coaxially aligned with the first axis 24, at least one superconductive main coil 30 generally coaxially aligned with the second axis 28 and carrying a second main electric current in the previously-defined first direction, and a second magnet pole piece 42 generally coaxially aligned with the second axis 28 and spaced apart from the at least one superconductive main coil 30 of the second assembly 14. The nonmagnetizable first and second support members 16 and 18 each are generally vertically aligned, each have a first longitudinal end 32 attached to the first magnet pole piece 40, and each have a second longitudinal end 34 attached to the second magnet pole piece 42. The first and second support members 16 and 18 are not diametrically aligned and are the only support members of the open magnet 10 which are attached to both the first and second magnet pole pieces 40 and 42. The first cryocooler coldhead 20 is generally horizontally aligned and has a first housing 36 which is attached to, and receives weight-bearing support from, one of the first and second assemblies 12 and 14 proximate the first support member 16. The second cryocooler coldhead 22 is generally horizontally aligned and has a second housing 38 which is attached to, and receives weight-bearing support from, one of the first and second assemblies 12 and 14 proximate the second support member 18.

In one design, the first assembly 12 also includes a first cryogenic vessel 64 surrounding the at least one superconductive main coil 26 of the first assembly 12, a first thermal shield 46 generally surrounding the first cryogenic vessel 64, and a first vacuum enclosure 48 surrounding the first thermal shield 46. Likewise, the second assembly 14 also includes a second cryogenic vessel 66 surrounding the at least one superconductive main coil 30 of the second assembly 14, a second thermal shield 50 generally surrounding the second cryogenic vessel 66, and a second vacuum enclosure 52 surrounding the second thermal shield 50. The first cryogenic vessel 64 contains a first cryogenic fluid 68, and the second cryogenic vessel 66 contains a second cryogenic fluid 70. In one construction, the second cryogenic vessel 66 is in fluid communication with the first cryogenic vessel 64, and the first and second cryogenic fluids 68 and 70 comprise the same cryogenic fluid. An example of a cryogenic fluid is liquid helium. It is noted that some liquid helium will boil off as gaseous helium which will collect above the liquid helium in the first cryogenic vessel 64. In this construction, a cryogenic-vessel conduit would interconnect the first and second cryogenic vessels 64 and 66, a thermal-shield conduit would generally surround the cryogenic-vessel conduit and would interconnect the first and second thermal shields 46 and 50, and a vacuum-enclosure conduit (which could be part or all of a support member) would surround the thermal-shield conduit and would interconnect the first and second vacuum enclosures. Such conduits have been omitted from the figures for clarity.

In one construction, the first housing 36 of the first cryocooler coldhead 20 is attached to, and receives weight-bearing support from, the first vacuum enclosure 48 of the first assembly 12. In this construction, the first cryocooler coldhead 20 is a two-stage cryocooler coldhead having a first stage 44 and a second stage 72 which is colder than the first stage 44. The second stage 72 is disposed within the first cryogenic vessel 64 (to recondense boiledoff liquid helium), and the first stage 44 is disposed in solid conduction thermal contact with the first thermal shield 46. It is noted that the second stage 72 is considered to be disposed within the first cryogenic vessel 64 if a pair of recondensing tubes (not shown) extends from a condenser portion of the second stage 72 and penetrates the first cryogenic vessel 64. In one design (not shown), the first housing 36 is a sleeve which also surrounds the first and second stages 44 and 72 wherein the first cryocooler coldhead 20 can be replaced without loss of vacuum, such sleeve arrangement being known to those skilled in the art. In the embodiment shown in FIGS. 1–3, there is no cryocooler coldhead attached to the second assembly 14.

However, in a different embodiment of the open magnet 110 shown in FIGS. 4–5 (which is the same as the embodiment shown in FIGS. 1–3 except for the placement of the second cryocooler coldhead), the second housing 138 of the second cryocooler coldhead 122 is attached to, and receives weight-bearing support from, the second vacuum enclosure 152 of the second assembly 114. In one construction, the second cryocooler coldhead 122 is a single-stage cryocooler coldhead having a first stage 154 which is disposed in solid conduction thermal contact with the second thermal shield 150. In one design, the first cryocooler coldhead 120 has a first central axis 156 (which is the axis of its coldhead cylinder and displacer piston, not shown), and the second cryocooler coldhead 122 has a second central axis 158, wherein the first central axis 156 and the second central axis 158 both generally lie in a common vertical plane. In this design, the first support member 116 has a first longitudinal axis 160, and the second support member 118 has a second longitudinal axis 162, wherein the first and second longitudinal axes 160 and 162 both generally lie in the common vertical plane of the first and second central axes 156 and 158.

Returning to the embodiment of FIGS. 1–3, it is seen that the second housing 38 of the second cryocooler coldhead 22 is attached to, and receives weight-bearing support from, the first vacuum enclosure 48 of the first assembly 12. In one construction, the second cryocooler coldhead 22 is a single-stage cryocooler coldhead having a first stage 54 disposed in solid conduction thermal contact with the first thermal shield 46. In one design, the first cryocooler coldhead 20 has a first central axis 56, and the second cryocooler coldhead 22 has a second central axis 58, wherein the second central axis 58 is generally coincident with the first central axis 56. In this design, the first support member 16 has a first longitudinal axis 60, and the second support member 18 has a second longitudinal axis 62, wherein the first and second longitudinal axes 60 and 62 and the first and second central axes 56 and 58 all generally lie in a common vertical plane.

Several benefits and advantages are derived from the invention. Applicants found that, when the cryocooler coldheads are attached to, and receive weight-bearing support from, the first and/or second assembly, having the cryocooler coldhead(s) be horizontally aligned reduces vibration imparted to the assemblies by the cryocooler coldhead(s). Such vibrations are also reduced, in two-cryocooler and two-support-member magnets, by positioning the two horizontal cryocoolers in opposing alignment and in the same vertical plane as the two support members. Applicants found that cryocooler vibrations cause vibration of the superconductive main coils, cause unwanted eddy-currents generated by vibrations of the thermal shields, and cause unwanted movement of the superconductive coils relative to the pole pieces all contributing to MRI image degradation (including "ghosting" in images). It is noted that when the support member(s) provide a "clam-shell" support for the assemblies, the superconductive coils of such assemblies are subject to a significant "clam-shell" vibration from the cryocooler coldhead(s) which is likened to the partial closing and opening of a clam shell. It is noted that a "clam-shell" support is provided by having only two support members, especially when the two support members are not diametrically aligned (such as being aligned between generally 110 and 150 degrees apart). Such clam-shell support is a very open support providing ease of patient table access to the imaging volume and providing ease of patient positioning within the imaging volume.

It should be noted that additional superconductive main coils, superconductive shielding coils, superconductive correction coils, and magnetizable rings may be present, as is known to the artisan, but such coils and rings have been omitted from the figures for clarity. Likewise, coil forms (if needed) to support the superconductive main coils and spacers to position a thermal shield with respect to a cryogenic vessel and to position a thermal shield with respect to a vacuum enclosure have been omitted from the figures but are well known to those skilled in the art. In an example, the open magnet 10 is a 0.5 or higher Tesla magnet, and the cryocooler coldheads are Gifford McMahon cryocooler coldheads.

Applicants know that cryocooler-imparted vibration to the first and second assemblies 12 and 14 can be reduced by providing a vertically-aligned, flexible bellows attachment (not shown) of a vertically-aligned cryocooler coldhead to the vacuum enclosure while structurally and rigidly supporting the cryocooler coldhead from a support ceiling or a separate floor mount. Applicants also know that cryocooler-imparted vibration to a vertically-aligned open magnet can be reduced by providing the bottom assembly with a skirt floor mount (not shown), instead of conventional foot floor mounts found on horizontally-aligned open magnets, with the skirt being, for example, a vertical extension (with a horizontal radially-outwardly-extending horizontal rim) of the wall of the second vacuum enclosure 52 of the second assembly 14. The present invention, the cryocooler coldhead flexible attachment, and the magnet skirt can be used alone, or in any appropriate combination, as can be chosen by the artisan to meet the requirements of a particular magnet design. The stiffness of the support members, the stiffness of the cryocooler coldhead flexible attachment, and the stiffness of the magnet skirt can be chosen by those skilled in the art to reduce cryocooler-imparted vibration to the first and second assemblies 12 and 14 while providing structural support against gravitational and electromagnetic forces.

The foregoing description of several expressions and embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. An open magnet comprising:
   a) a first assembly including:
      (1) a longitudinally-extending and generally-vertically-aligned first axis; and
      (2) at least one superconductive main coil generally coaxially aligned with said first axis and carrying a first main electric current in a first direction;
   b) a second assembly longitudinally spaced apart from and disposed generally vertically below said first assembly and including:
      (1) a longitudinally-extending second axis generally coaxially aligned with said first axis; and
      (2) at least one superconductive main coil generally coaxially aligned with said second axis and carrying a second main electric current in said first direction;
   c) at least one support member which is generally-vertically-aligned, which has a first longitudinal end attached to said first assembly, and which has a second longitudinal end attached to said second assembly providing cantilevered support to said first assembly; and
   d) at least one cyrocooler coldhead which is aligned generally horinzontally and which has a housing attached to, and is proximate to said at least one support member supported by one of said first and second assemblies.

2. The magnet of claim 1, wherein said first assembly includes a first magnet pole piece generally-vertically-aligned to be coaxially aligned with said first axis and spaced apart from said at least one superconductive main coil of said first assembly, and wherein said second assembly includes a second magnet pole piece generally-vertically-aligned to be coaxially aligned with said second axis and spaced apart from said at least one superconductive main coil of said second assembly.

3. The magnet of claim 2, wherein said at least one support member is a non-magnetic material, wherein said first longitudinal end of said at least one support member is attached to said first magnet pole piece, and wherein said second longitudinal end of said at least one support member is attached to said second magnet pole piece.

4. The magnet of claim 1, wherein said at least one cryocooler coldhead includes a first cryocooler coldhead having a first housing and a first cold temperature stage, and wherein said first housing is attached to, and supported by, said first assembly.

5. The magnet of claim 4, wherein said first assembly also includes a first thermal shield generally surrounding said at least one superconductive main coil of said first assembly and a first vacuum enclosure surrounding said first thermal shield, wherein said first housing is attached to, and receives weight-bearing support from, said first vacuum enclosure, and wherein said first stage of said first cryocooler coldhead is thermally connected to said first thermal shield.

6. The magnet of claim 1, wherein said at least one cryocooler coldhead includes a second cryocooler coldhead having a second housing and a cryocooler including at least a first cold temperature stage, wherein said second housing is attached to, and supported by, said second assembly.

7. The magnet of claim 6, whereinsaid second assembly also includes a second thermaly shield generally surrounding said at least one superconductive main coil of said second assembly and a second vacuum enclosure surrounding said second thermal shield, wherein said second housing is attached to, and supported by, said second vacuum enclosure, and wherein said second cryocooler includes at least a first cold temperature stage of said second crycooler coldhead which is thermally connected to second thermal shield.

8. The magnet of claim 1, wherein said at least one cryocooler coldhead includes a first cryocooler coldhead having a first central axis and a first housing and includes a second cryocooler coldhead having a second central axis and a second housing, wherein said first housing is attached to, and is supported by said first assembly and said second housing is attached to, and receives weight-bearing support from, said second assembly, and wherein said first central axis and said second central axis are generally-vertically-aligned in a common vertical plane.

9. The magnet of claim 1, wherein said at least one cryocooler coldhead includes a first cryocooler coldhead having a first central axis and a first housing and includes a second cryocooler coldhead having a second central axis and second housing, wherein said first and second housings each are attached to, and supported by, said first assembly, and wherein said second central axis is aligned generally horizontal to coincide with said first central axis.

10. The magnet of claim 9, wherein said at least one support member consists of a first support member having a first longitudinal axis and a second support member having a second longitudinal axis, wherein said first and second longitudinal axes and said first and second central axes all generally vertically aligned.

11. An open magnet comprising:
a) a first assembly including:
  (1) a longitudinally-extending and generally-vertically-aligned first axis;
  (2) at least one superconductive main coil generally-vertically-aligned to be coaxially aligned with said first axis and carrying a first main electric current in a first direction; and
  (3) a first magnet pole piece generally-vertically-aligned to be coaxially aligned with said first axis and spaced apart from said at least one superconductive main coil of said first assembly;
b) a second assembly longitudinally spaced apart from and disposed generally vertically below said first assembly and including:
  (1) a longitudinally-extending second axis generally-vertically-aligned to be coaxially aligned with said first axis;
  (2) at least one superconductive main coil generally coaxially aligned with said second axis and carrying a second main electric current in said first direction; and
  (3) a second magnet pole piece generally-vertically-aligned to be coaxially aligned with said second axis and spaced apart from said at least one superconductive main coil of said second assembly;
c) non-magnetic first and second support members each generally-vertically-aligned, each having a first longitudinal end attached to said first magnet pole piece, and each having a second longitudinal end attached to said second magnet pole piece, wherein said first and second support members are not diametrically aligned, and wherein said first and second support members are the only support members of said open magnet which are attached to both said first and second magnet pole pieces;
d) a first cryocooler coldhead generally horizontally aligned and having a first housing attached to, and supported by one of said first and second assemblies proximate said first support member; and
e) a second cryocooler coldhead generally horizontally aligned and having a second housing attached to, and supported by one of said first and second assemblies proximate said second support member.

12. The magnet of claim 11, wherein said first assembly also includes a first cryogenic vessel surrounding said at least one superconductive main coil of said first assembly, a first thermal shield generally surrounding said first cryogenic vessel, and a first vacuum enclosure surrounding said first thermal shield, and wherein said second assembly also includes a second cryogenic vessel surrounding said at least one superconductive main coil of said second assembly, a second thermal shield generally surrounding said second cryogenic vessel, and a second vacuum enclosure surrounding said second thermal shield.

13. The magnet of claim 12, wherein said first cryogenic vessel contains a first cryogenic fluid, wherein said second cryogenic vessel contains a second cryogenic fluid.

14. The magnet of claim 13, wherein said first housing of said first cryocooler coldhead is attached to, and receives weight-bearing support from, said first vacuum enclosure, wherein said first cryocooler coldhead is a two-stage cryocooler coldhead having a first stage and a second stage which is colder than said first stage, wherein said second stage is disposed within said first cryogenic vessel, and wherein said first stage of said first cryocooler coldhead is thermally connected to with said first thermal shield.

15. The magnet of claim 14, wherein said second housing of said second cryocooler coldhead is attached to, and receives weight-bearing support from, said second vacuum enclosure, wherein said second cryocooler coldhead is a single-stage cryocooler coldhead having a first stage, and wherein said first stage of said second cryocooler coldhead is thermally connected to with said second thermal shield.

16. The magnet of claim 15, wherein said first cryocooler coldhead has a first central axis and said second cryocooler coldhead has a second central axis, and wherein said first central axis and said second central axis are-aligned-generally horizontally in a common vertical plane.

17. The magnet of claim 16, wherein said first support member has a first longitudinal axis and said second support member has a second longitudinal axis, and wherein said first and second longitudinal axes are generally-vertically-aligned in said common vertical plane.

18. The magnet of claim 14, wherein said second housing of said second cryocooler coldhead is attached to, and receives weight-bearing support from, said first vacuum enclosure, wherein said second cryocooler coldhead is a single-stage cryocooler coldhead having a first stage, and wherein said first stage of said second cryocooler coldhead is thermally connected to with said first thermal shield.

19. The magnet of claim 18, wherein said first cryocooler coldhead has a first central axis and said second cryocooler coldhead has a second central axis, and wherein said second central axis is aligned generally horizontally to coincide with said first central axis.

20. The magnet of claim 19, wherein said first support member has a first longitudinal axis and said second support member has a second longitudinal axis, and wherein said first and second longitudinal axes and said first and second central axes all are generally-vertical-aligned in a common vertical plane.

* * * * *